(12) United States Patent
Chen

(10) Patent No.: US 8,890,614 B2
(45) Date of Patent: Nov. 18, 2014

(54) OPERATIONAL AMPLIFIER MODULE AND METHOD FOR INCREASING SLEW RATE OF OPERATIONAL AMPLIFIER CIRCUIT

(71) Applicant: Novatek Microelectronics Corp., Hsinchu (TW)

(72) Inventor: Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 90 days.

(21) Appl. No.: 13/776,734

(22) Filed: Feb. 26, 2013

(65) Prior Publication Data

US 2014/0077880 A1   Mar. 20, 2014

(30) Foreign Application Priority Data

Sep. 19, 2012   (TW) .............................. 101134318 A

(51) Int. Cl.
*H03F 3/45* (2006.01)
(52) U.S. Cl.
CPC .. *H03F 3/45076* (2013.01); *H03F 2203/45248* (2013.01); *H03F 3/45475* (2013.01)
USPC .......................................... 330/261; 330/260

(58) Field of Classification Search
USPC .................................. 330/261, 260, 285, 296
See application file for complete search history.

(56) References Cited

U.S. PATENT DOCUMENTS

| 4,730,168 | A  | * | 3/1988 | Senderowicz et al. | ......... 330/253 |
| 7,652,538 | B2 | * | 1/2010 | Choi | .............................. 330/292 |
| 8,531,242 | B2 | * | 9/2013 | Chung | ........................... 330/255 |

* cited by examiner

*Primary Examiner* — Henry Choe
(74) *Attorney, Agent, or Firm* — Jianq Chyun IP Office

(57) ABSTRACT

An operational amplifier module including an operational amplifier circuit, a rate-increasing circuit and an overdriving circuit is provided. The operational amplifier switches an input voltage to an output voltage and outputs the switched output voltage. The rate-increasing circuit receives the input voltage and the output voltage and increases the rate of switching the input voltage to the output voltage according to the difference between the input voltage and the output voltage. The overdriving circuit provides an overdriving voltage to the rate-increasing circuit and the operational amplifier circuit during an overdriving period according to a selection signal. The level of the overdriving voltage is higher or lower than the levels of the input voltage and the output voltage. Furthermore, a method for increasing the slew rate of the operational amplifier circuit is provided.

12 Claims, 5 Drawing Sheets

OPERATIONAL AMPLIFIER MODULE AND METHOD FOR INCREASING SLEW RATE OF OPERATIONAL AMPLIFIER CIRCUIT

CROSS-REFERENCE TO RELATED APPLICATION

This application claims the priority benefit of Taiwan application serial no. 101134318, filed on Sep. 19, 2012. The entirety of the above-mentioned patent application is hereby incorporated by reference herein and made a part of this specification.

TECHNICAL FIELD

The disclosure relates to a load driving module and a method of increasing signal-switching a rate thereof, and particularly relates to an operational amplifier module and a method of increasing a slew rate thereof.

BACKGROUND

Generally speaking, the conventional analog circuits process signals in the voltage mode, and voltage operational amplifiers (OP Amp) are commonly used by circuit designers due to the low cost and stable technology of the voltage operational amplifiers. However, the conventional voltage operational amplifiers are insufficient in transient response swiftness, which results an limitation on signal-processing design for the circuit designers. To free themselves from such limitation on signal-processing design, the circuit designers usually try to solve this issue by increasing the internal slew rate of the operational amplifiers.

FIG. 1 is a schematic diagram illustrating a conventional operational amplifier. Referring to FIG. 1, a conventional operational amplifier 100 has a feedback configuration. Namely, an output terminal and an inverting input terminal (−) of the operational amplifier 100 are coupled to each other. In this example, when different input voltages Vin are input to a non-inverting input terminal (+) of the operational amplifier 100, the output terminal of the operational amplifier 100 generates different output voltages Vo. FIG. 2 is a waveform diagram illustrating an output voltage of the conventional operational amplifier. Referring to FIG. 2, the operational amplifier 100 is configured to switch the input voltage Vin to the output voltage Vout, wherein a switching rate of the operational amplifier 100 is determined by a ratio ($I_B/C_M$) between a bias current ($I_B$) at an input stage of the operational amplifier and an internal compensation capacitance ($C_M$) of the operational amplifier. The ratio is termed as the slew rate SR (i.e. $SR=I_B/C_M$). Therefore, if the internal slew rate of the conventional operational amplifiers is to be increased, the bias current at the input stage of the operational amplifier needs to be increased, or the compensation capacitance needs to be reduced.

SUMMARY

The disclosure provides an operational amplifier module including an overdriving voltage to increase a slew rate of an operational amplifier circuit.

The disclosure provides a method of increasing a slew rate of an operational amplifier circuit adapted for an application of the operational amplifier module.

The disclosure provides an operational amplifier module that includes an operational amplifier circuit, a rate-increasing circuit, and an overdriving circuit. The operational amplifier circuit is configured to switch an input voltage to an output voltage and output the output voltage. The rate-increasing circuit is coupled to the operational amplifier circuit. The rate-increasing circuit is configured to receive the input voltage and the output voltage and increase a rate of switching the input voltage to the output voltage based on a difference between the input voltage and the output voltage. The overdriving circuit is coupled to the rate-increasing circuit. The overdriving circuit is configured to provide an overdriving voltage to the rate-increasing circuit and the operational amplifier circuit during an overdriving period according to a selection signal. A level of the overdriving voltage is higher or lower than levels of the input voltage and the output voltage.

In an embodiment of the disclosure, the overdriving circuit includes a voltage selection unit. The voltage selection unit is coupled to the rate-increasing circuit. The voltage selection unit is configured to provide the overdriving voltage to the rate-increasing circuit and the operational amplifier circuit during the overdriving period according to the selection signal. The voltage selection unit is configured to provide the input voltage to the rate-increasing circuit and the operational amplifier circuit during a first driving period before the overdriving period. Moreover, the voltage selection unit is configured to provide the output voltage to the rate-increasing circuit and the operational amplifier circuit during a second driving period after the overdriving period.

In an embodiment of the disclosure, the voltage selection unit has a plurality of input terminals, an output terminal, and a control terminal. The plurality of input terminals of the voltage selection unit are respectively configured to receive the input voltage, the output voltage, and the overdriving voltage. The control terminal of the voltage selection unit receives the selection signal. The output terminal of the voltage selection unit outputs the input voltage, the output voltage, and the overdriving voltage to the rate-increasing circuit and the operational amplifier circuit according to the selection signal.

In an embodiment of the disclosure, when the level of the input voltage is lower than the level of the output voltage, the level of the overdriving voltage is higher than the levels of the input voltage and the output voltage.

In an embodiment of the disclosure, when the level of the input voltage is higher than the level of the output voltage, the level of the overdriving voltage is lower than the levels of the input voltage and the output voltage.

In an embodiment of the disclosure, the operational amplifier circuit has a first input terminal, a second input terminal, and an output terminal. The first input terminal of the operational amplifier circuit is configured to receive the input voltage. The second input terminal of the operational amplifier circuit is configured to receive the output voltage. The output terminal of the operational amplifier is coupled to the second input terminal of the operational amplifier to output the output voltage.

In an embodiment of the disclosure, the rate-increasing circuit has a first input terminal, a second input terminal, and an output terminal. The first input terminal of the rate-increasing circuit is coupled to the first input terminal of the operational amplifier and a first input terminal of the overdriving circuit to receive the input voltage, the output voltage, or the overdriving voltage. The second input terminal of the rate-increasing circuit is coupled to the second input terminal of the operational amplifier to receive the output terminal.

In an embodiment of the disclosure, the output terminal of the rate-increasing circuit provides a rate-increasing current to the operational amplifier circuit or extracts the rate-increasing current from the operational amplifier circuit according to the difference between the input voltage and the output voltage, so as to change a value of a bias current of the operational amplifier circuit.

The disclosure provides a method of increasing a slew rate of an operational amplifier circuit, including the following. An input voltage and an output voltage of the operational amplifier circuit are received. A rate-increasing current is provided to the operational amplifier circuit or the rate-increasing current is extracted from the operational amplifier circuit according to a difference between the input voltage and the output voltage, so as to change a value of a bias current of the operational amplifier circuit. An overdriving voltage is provided to the operational amplifier circuit during an overdriving period according to a selection signal, so as to increase a rate of switching the input voltage to the output voltage. A level of the overdriving voltage is higher or lower than levels of the input voltage and the output voltage.

In an embodiment of the disclosure, the method of increasing the slew rate further includes the following. The input voltage is provided to the operational amplifier circuit during a first driving period before the overdriving period. The output voltage is provided to the operational amplifier circuit during a second driving period after the overdriving period.

In an embodiment of the disclosure, when the level of the input voltage is lower than the level of the output voltage, the level of the overdriving voltage is higher than the levels of the input voltage and the output voltage.

In an embodiment of the disclosure, when the level of the input voltage is higher than the level of the output voltage, the level of the overdriving voltage is lower than the levels of the input voltage and the output voltage.

In view of the above, in the exemplary embodiments of the disclosure, the overdriving circuit provides the overdriving voltage higher or lower than the output voltage to the rate-increasing circuit during the overdriving period, such that the input voltage is adjusted to a higher or lower potential beforehand, so as to increase the slew rate of the operational amplifier.

In order to make the aforementioned and other features and advantages of the present invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
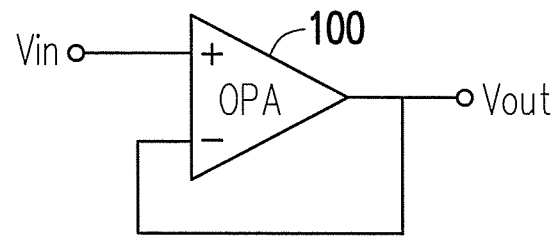
FIG. 1 is a schematic diagram illustrating a conventional operational amplifier.
Figure 2:
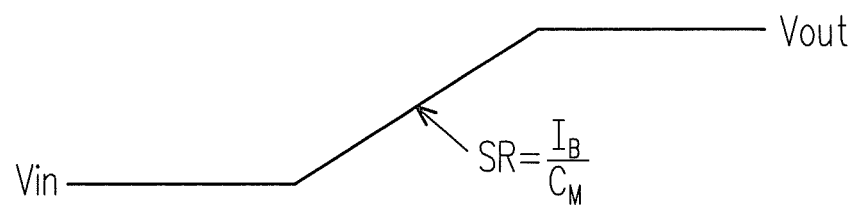
FIG. 2 is a waveform diagram illustrating an output voltage of the conventional operational amplifier.
Figure 3:
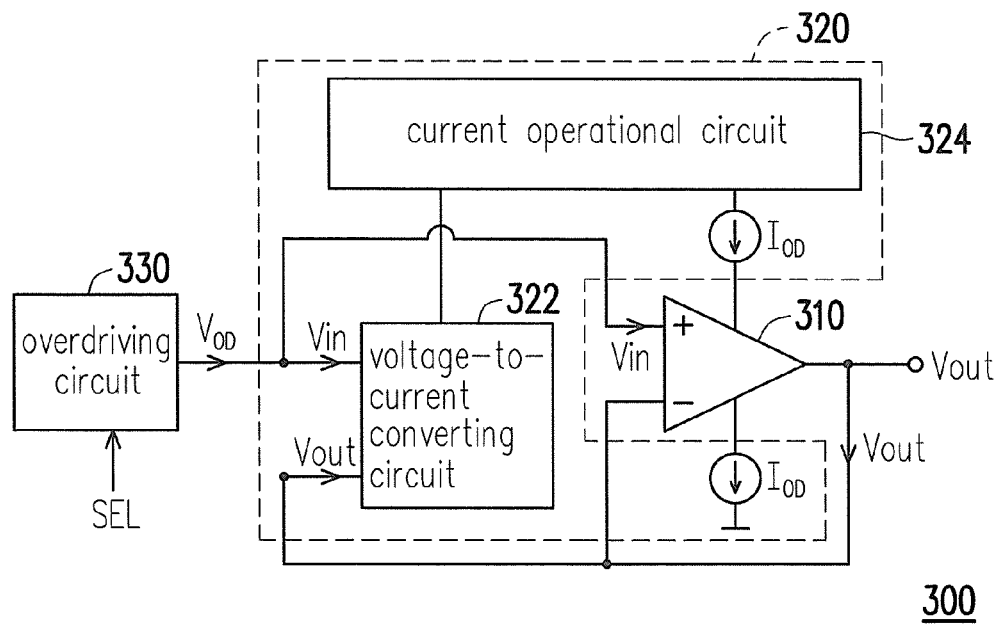
FIG. 3 is a block diagram illustrating an operational amplifier module according to an embodiment of the disclosure.

FIG. 3 is a block diagram illustrating an operational amplifier module according to an embodiment of the disclosure. Referring to FIG. 3, an operational amplifier module 300 of this embodiment includes an operational amplifier circuit 310, a rate-increasing circuit 320, and an overdriving circuit 330. The operational amplifier 310 is configured to switch an input voltage Vin to an output voltage Vout, and outputs the output voltage Vout to a circuit at a next stage or a load driven thereby. The rate-increasing circuit 320 is coupled to the operational amplifier circuit 310. The rate-increasing circuit 320 is configured to receive the input voltage Vin and the output voltage Vout and increases a rate of switching the input voltage Vin to the output voltage Vout according to a difference between the input voltage Vin and the output voltage Vout. The overdriving circuit 330 is coupled to the rate-increasing circuit 320. The overdriving circuit 330 is configured to provide an overdriving voltage $V_{OD}$ to the rate-increasing circuit 320 during an overdriving period according to a selection signal SEL.

In this embodiment, when a level of the input voltage Vin is lower than a level of the output voltage Vout, a level of the overdriving voltage $V_{OD}$ is higher than the levels of the input voltage Vin and the output voltage Vout. Alternatively, when the level of the input voltage Vin is higher than the level of the output voltage Vout, the level of the overdriving voltage $V_{OD}$ is lower than the levels of the input voltage Vin and the output voltage Vout.

Specifically speaking, the operational amplifier circuit 310 of this embodiment has a feedback configuration, wherein an output terminal of the operational amplifier circuit 310 is coupled to an inverting input terminal (−) to output the output voltage Vout. A non-inverting input terminal (+) of the operational amplifier circuit 310 is configured to receive the input voltage Vin, and the inverting input terminal (−) is configured to receive the output voltage Vout. The rate-increasing circuit 320 includes a voltage-to-current converting circuit 322 and a current operational circuit 324. Two input terminals of the voltage-to-current converting circuit 322 are respectively configured to receive the input voltage Vin and the output voltage Vout. In addition, the difference between the input voltage Vin and the output voltage Vout is compared to provide a comparison result to the current operational circuit 324. The current operational circuit 324 determines a value of a rate-increasing current $I_{OD}$ based on the comparison result, and provides the rate-increasing current $I_{OD}$ to the operational amplifier circuit 310 to increase a value of a bias current of the operational amplifier circuit 310. In this example, the comparison result provided by the voltage-to-current converting circuit 322 is, for example, a reference current corresponding to the voltage difference between the input and output voltages. The current operational circuit 324 reflects the reference current as the rate-increasing current IOD, for example, so as to provide the rate-increasing current $I_{OD}$ to the operational amplifier circuit 310.

Figure 4:
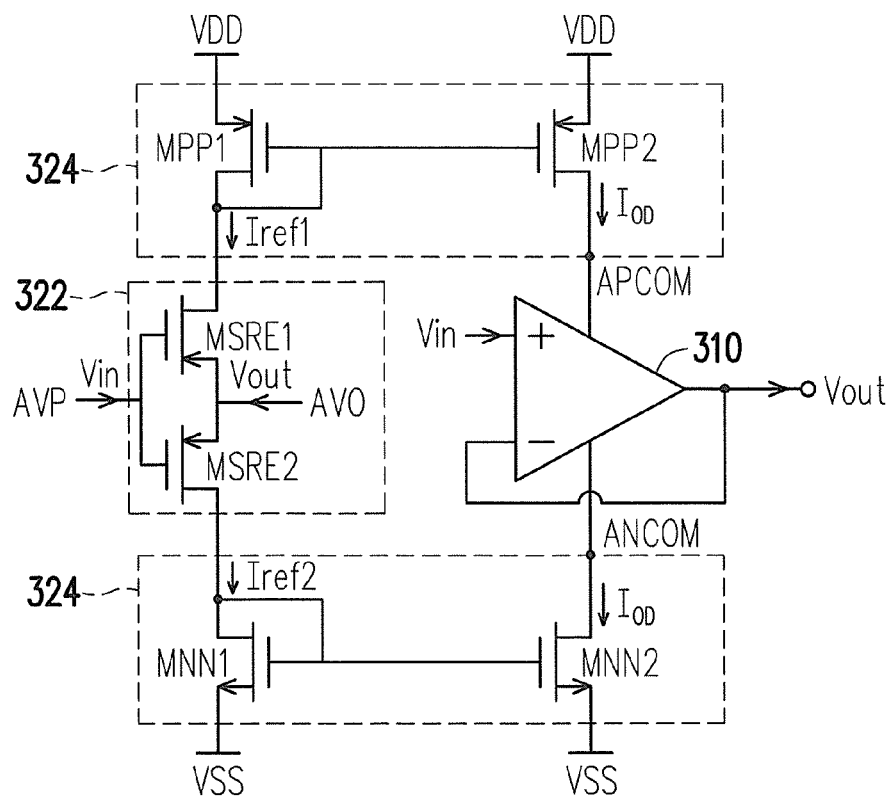
FIG. 4 is a schematic diagram illustrating a rate-increasing circuit according to an embodiment of the disclosure.

FIG. 4 is a schematic diagram illustrating a rate-increasing circuit according to an embodiment of the disclosure. Referring to FIG. 4, in this embodiment, when the input voltage Vin is switched to the output voltage Vout with a higher value, the input voltage Vin of the operational amplifier circuit 310 increases immediately. At this time, a voltage of an input terminal AVP of the voltage-to-current converting circuit 322 is higher than a voltage of another input terminal AVO, so as to conduct a transistor MSRE1. The transistor MSRE1 that is conducted extracts a reference current Iref1 from a transistor MPP1. Therefore, the current operational circuit 324 having a current mirror configuration reflects the reference current Iref1 as the rate-increasing current $I_{OD}$ and provides the rate-increasing current $I_{OD}$ to the operational amplifier current 310 to increase the value of the bias current.

Figure 5:
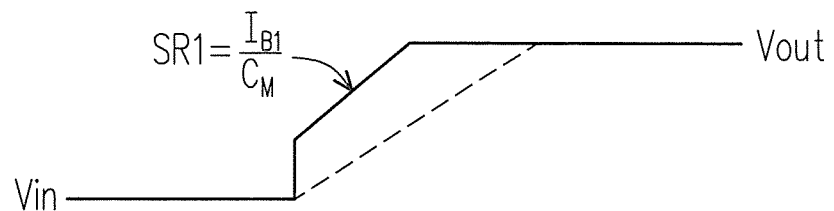
FIG. 5 is a waveform diagram illustrating an output voltage of the operational amplifier of FIG. 3.

By compensating the bias current as described above, a slew rate of the operational amplifier circuit 310 is allowed to effectively increase. FIG. 5 is a waveform diagram illustrating an output voltage of the operational amplifier of FIG. 3. Referring to FIG. 5, since a bias current IB1 of this embodiment is compensated by the rate-increasing current IOD, a bias current at an input stage of the operational amplifier current 310 increases given that a compensation capacitance inside the operational amplifier circuit 310 remains constant, a slew rate SR1 consequently increases.

In another embodiment, when the input voltage Vin is switched to the output voltage Vout with a lower value, the input voltage Vin of the operational amplifier 310 drops immediately. At this time, the voltage of the input terminal AVP of the voltage-to-current converting circuit 322 is lower than the voltage of another input terminal AVO, so as to conduct a transistor MSRE2. The transistor MSRE2 that is conducted generates another reference current Iref2 to a transistor MNN1. Therefore, the current operational circuit 324 having the current mirror configuration reflects the reference current Iref2 as the rate-increasing current $I_{OD}$ and extracts the bias current from the operational amplifier circuit 310 to reduce the value of the bias current. In this way, the rate of switching the input voltage Vin to the output voltage Vout may also increase.

Under a circumstance in which the overdriving circuit 330 of this embodiment is not activated, a body effect of the transistors MSRE1 and MSRE2 causes a charge/discharge-facilitating mechanism to prematurely terminate and renders a limited increase of the slew rate. Therefore, the overdriving circuit 330 of this embodiment provides the overdriving voltage $V_{OD}$ to the rate-increasing circuit 320 during the overdriving period according to the selectional signal SEL to overcome the limited effect. Details in this respect are provided below.

Figure 6:
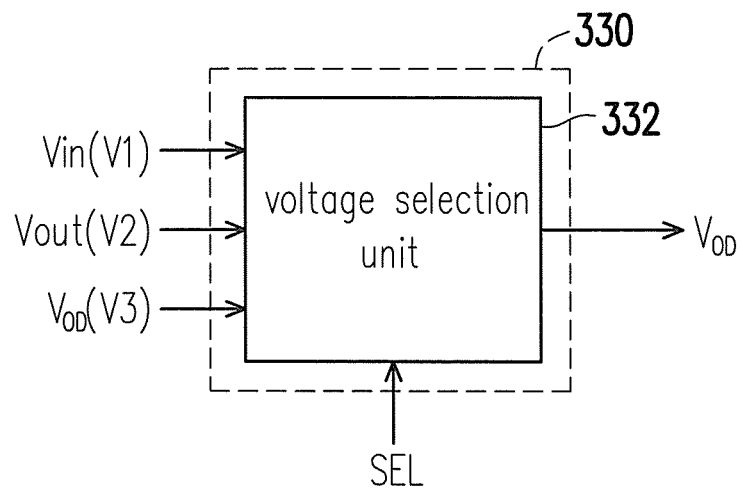
FIG. 6 is a schematic diagram illustrating a rate-increasing circuit according to an embodiment of the disclosure.

FIG. 6 is a schematic diagram illustrating a rate-increasing circuit according to an embodiment of the disclosure. Referring to FIGS. 3 and 6, the overdriving circuit 330 of this embodiment includes a voltage selection unit 332. The voltage selection unit 332 is coupled to the rate-increasing circuit 320. The voltage selection unit 332 is configured to provide the overdriving voltage $V_{OD}$ to the rate-increasing circuit 320 during the overdriving period according to the selection signal SEL. Therefore, the voltage selection unit 332 is, for example, a multiplexer having a plurality of input terminals.

Specifically speaking, in this embodiment, the plurality of input terminals of the voltage selection unit 332 are respectively configured to receive the input voltage Vin, the output voltage Vout, and the overdriving voltage $V_{OD}$. Voltage values of the input voltage Vin, the output voltage Vout, and the overdriving voltage $V_{OD}$ are respectively V1, V2, and V3. In addition, the voltage value V3 is larger than the voltage values V1 and V2 in this example. A control terminal of the voltage selection unit 332 receives the selection signal SEL. An output terminal of the voltage selection unit 322 outputs one of the input voltage Vin, the output voltage Vout, and the overdriving voltage $V_{OD}$ according to the selection signal SEL.

Figure 7:
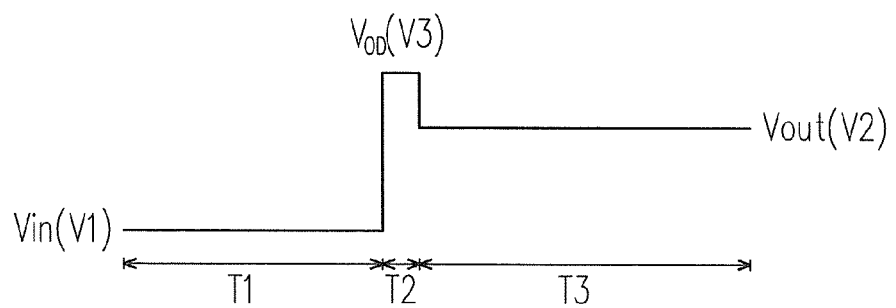
FIG. 7 is a waveform diagram illustrating an input voltage of the operational amplifier circuit of FIG. 6.
Figure 8:
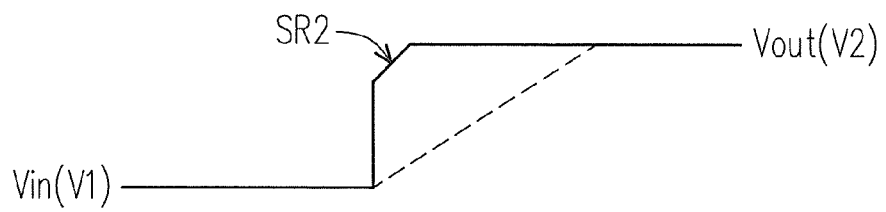
FIG. 8 is a waveform diagram illustrating an output voltage of the operational amplifier circuit of FIG. 3.

For example, FIG. 7 is a waveform diagram illustrating an input voltage of the operational amplifier circuit of FIG. 6, and FIG. 8 is a waveform diagram illustrating an output voltage of the operational amplifier circuit of FIG. 3. Referring FIGS. 6-8, the operational amplifier circuit 310 of this embodiment switches the input voltage Vin with the voltage value V1 to the output voltage Vout with the voltage value V2, for example, wherein the voltage value V2 is larger than the voltage value V1. During a first driving period T1, the voltage selection unit 332 provides the input voltage Vin with the voltage value V1 to the rate-increasing circuit 320 and the operational amplifier circuit 310. Then, during an overdriving period T2, the voltage selection unit 332 provides the overdriving voltage $V_{OD}$ with the voltage value V3 to the rate-increasing circuit 320 and the operational amplifier circuit 310, so as to provide the output voltage Vout with the voltage value V2 to the rate-increasing circuit 320 and the operational amplifier circuit 310 during a second driving period T3 after the operational amplifier circuit 310 is adjusted to a higher potential. To achieve an overdriving effect, the voltage value V3 is larger than the voltage values V1 and V2. Therefore, a slew rate SR2 of the operational amplifier circuit 310 is effectively increased with the above overdriving mechanism.

In addition, the overdriving mechanism in this embodiment may also effectively increase the slew rate SR2 of the operational amplifier circuit 310 when the input voltage Vin is switched to the output voltage Vout with a lower value. At this time, the voltage level of the overdriving voltage $V_{OD}$ is lower than the voltage levels of the input voltage Vin and the output voltage Vout.

Figure 9:
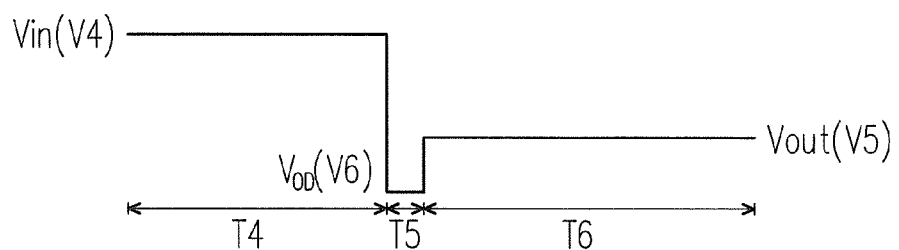
FIG. 9 is another waveform diagram illustrating an input voltage of the operational amplifier circuit of FIG. 6.
Figure 10:
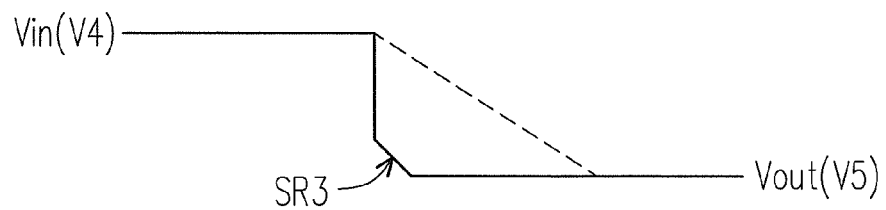
FIG. 10 is another waveform diagram illustrating an output voltage of the operational amplifier circuit of FIG. 3.

Specifically speaking, FIG. 9 is another waveform diagram illustrating an input voltage of the operational amplifier circuit of FIG. 6, and FIG. 10 is another waveform diagram illustrating an output voltage of the operational amplifier circuit of FIG. 3. Referring FIGS. 6, 9, and 10, in this embodiment, the operational amplifier circuit 310 switches the input voltage Vin with a voltage value V4 to the output voltage Vout with a voltage value V5, for example. In this example, the voltage value V4 of the input voltage Vin is larger than the voltage value V5 of the output voltage Vout. Similarly, during a first driving period T4, the voltage selection unit 332 provides the input voltage Vin with the voltage value V4 to the rate-increasing circuit 320 and the operational amplifier circuit 310. Then, during an overdriving period T5, the voltage selection unit 332 provides the overdriving voltage $V_{OD}$ with a voltage value V6 to the rate-increasing circuit 320 and the operational amplifier circuit 310, so as to provide the output voltage Vout with the voltage value V5 to the rate-increasing circuit 320 and the operational amplifier circuit 310 during a second driving period T6 after the operational amplifier circuit 310 is adjusted to a lower potential. To achieve the overdriving effect, the voltage value V6 is smaller than the voltage values V4 and V5 in this example. Therefore, a slew rate SR3 of the operational amplifier circuit 310 is effectively increased with the above overdriving mechanism.

Figure 11:
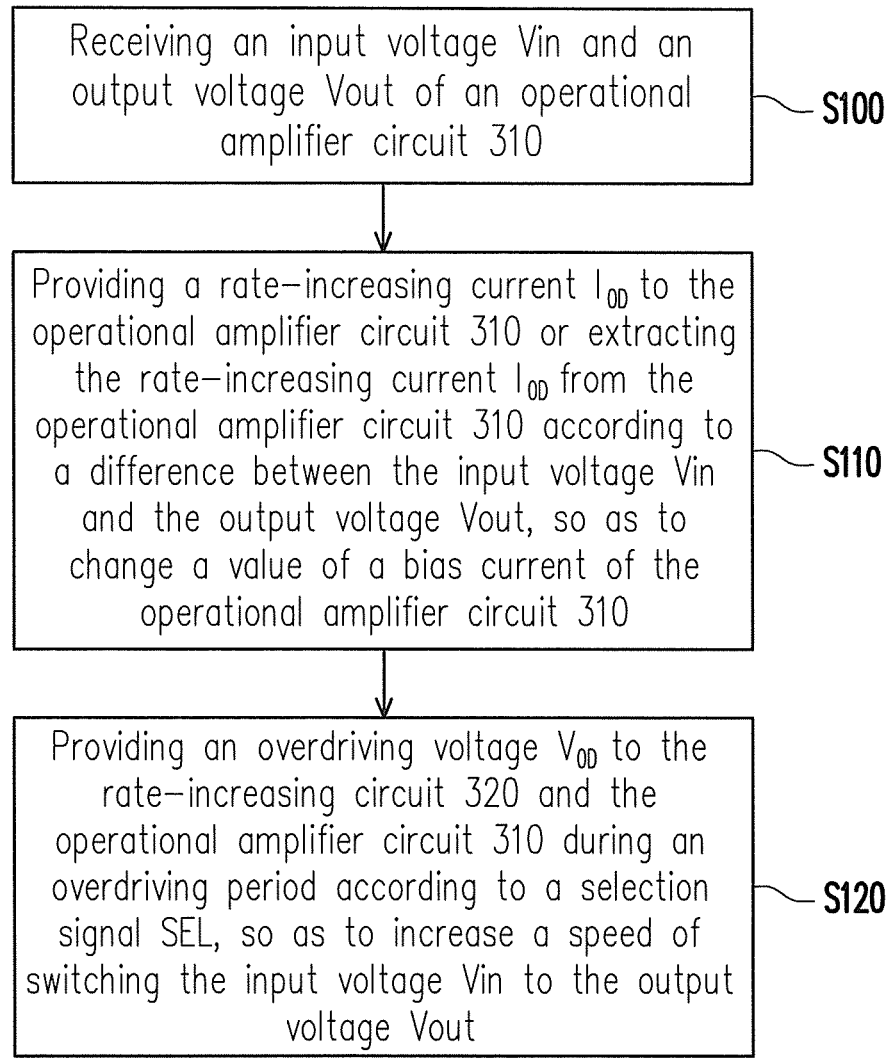
FIG. 11 is a procedural flowchart illustrating a method of increasing a slew rate of an operational amplifier circuit according to an embodiment of the disclosure.

FIG. 11 is a procedural flowchart illustrating a method of increasing a slew rate of an operational amplifier circuit according to an embodiment of the disclosure. Referring to FIGS. 3 and 11 together, a method of increasing the slew rate of the operational amplifier circuit of this embodiment includes the following. First, at step S100, the rate-increasing circuit 320 receives the input voltage Vin and the output voltage Vout of the operational amplifier circuit 310. Then, at step S110, the rate-increasing circuit 320 provides the rate-increasing current $I_{OD}$ to the operational amplifier circuit 310, or extracts the rate-increasing current $I_{OD}$ from the operational amplifier circuit 310 according to the difference between the input voltage Vin and the output voltage Vout, so as to change the value of the bias current of the operational amplifier circuit. Afterward, at step S120, the overdriving circuit 330 provides the overdriving voltage $V_{OD}$ to the rate-increasing circuit 320 and the operational amplifier circuit 310 during the overdriving period according to the selection signal SEL, so as to increase the rate of switching the input voltage Vin to the output voltage Vout. In this embodiment, the level of the overdriving voltage $V_{OD}$ is higher or lower than the levels of the input voltage Vin and the output voltage Vout.

In addition, the description of the embodiments illustrated in FIGS. 1-10 already provide sufficient teachings, suggestions, and embodying description for the method of improving the slew rate of the operational amplifier circuit of the embodiment of the disclosure, so details in this respect shall not be further reiterated.

In view of the above, in the exemplary embodiments of the disclosure, when the input voltage is lower than the output voltage, the overdriving circuit provides the overdriving voltage higher than the output voltage to the rate-increasing circuit and the operational amplifier circuit during the overdriving period, such that the input voltage is adjusted to a higher potential beforehand. On the contrary, when the input voltage is higher than the output voltage, the overdriving circuit provides the overdriving voltage lower than the output voltage to the rate-increasing circuit and the operational amplifier circuit during the overdriving period. Thereby, the slew rate of the operational amplifier circuit in the exemplary embodiments of the disclosure is effectively increased with the driving mechanism.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An operational amplifier module, comprising:
    an operational amplifier circuit, configured to switch an input voltage to an output voltage and output the output voltage;
    a rate-increasing circuit, coupled to the operational amplifier circuit and configured to receive the input voltage and the output voltage, wherein the rate-increasing circuit increases a rate of switching the input voltage to the output voltage according to a difference between the input voltage and the output voltage; and
    an overdriving circuit, coupled to the rate-increasing circuit and configured to provide an overdriving voltage to the rate-increasing circuit and the operational amplifier circuit during an overdriving period according to a selection signal,
    wherein a level of the overdriving voltage is higher or lower than levels of the input voltage and the output voltage.

2. The operational amplifier module as claimed in claim 1, wherein the overdriving circuit comprises:
    a voltage selection unit, coupled to the rate-increasing circuit and configured to provide the overdriving voltage to the rate-increasing circuit and the operational amplifier circuit during the overdriving period, wherein the input voltage is provided to the rate-increasing circuit and the operational amplifier circuit during a first driving period before the overdriving period, and the output voltage is provided to the rate-increasing circuit and the operational amplifier circuit during a second driving period after the overdriving period.

3. The operational amplifier module as claimed in claim 2, wherein the voltage selection unit comprises a plurality of input terminals, an output terminal, and a control terminal, wherein the plurality of input terminals of the voltage selection unit are respectively configured to receive the input voltage, the output voltage, and the overdriving voltage, the control terminal of the voltage selection unit receives the selection signal, the output terminal of the voltage selection unit outputs the input voltage, the output voltage, or the overdriving voltage to the rate-increasing circuit and the operational amplifier circuit according to the selection signal.

4. The operational amplifier module as claimed in claim 1, wherein when the level of the input voltage is lower than the level of the output voltage, the level of the overdriving voltage is higher than the levels of the input voltage and the output voltage.

5. The operational amplifier module as claimed in claim 1, wherein when the level of the input voltage is higher than the level of the output voltage, the level of the overdriving voltage is lower than the levels of the input voltage and the output voltage.

6. The operational amplifier module as claimed in claim 1, wherein the operational amplifier circuit has a first input terminal, a second input terminal, and an output terminal, wherein the first input terminal of the operational amplifier circuit is configured to receive the input voltage, the second input terminal of the operational amplifier circuit is configured to receive the output voltage, and the output terminal of the operational amplifier circuit is coupled to the second input terminal of the operational amplifier circuit to output the output voltage.

7. The operational amplifier module as claimed in claim 6, wherein the rate-increasing circuit has a first input terminal, a second input terminal, and an output terminal, wherein the first input terminal of the rate-increasing circuit is coupled to the first terminal of the operational amplifier circuit and a first terminal of the overdriving circuit to receive the input voltage, the output voltage, or the overdriving voltage, and the second terminal of the rate-increasing circuit is coupled to the second input terminal of the operational amplifier circuit to receive the input voltage.

8. The operational amplifier module as claimed in claim 7, wherein the output terminal of the rate-increasing circuit provides a rate-increasing current to the operational amplifier circuit or extracts the rate-increasing current from the operational amplifier circuit according to the difference between the input voltage and the output voltage, so as to change a value of a bias current of the operational amplifier circuit.

9. A method of increasing a slew rate of an operational amplifier circuit, comprising:
    receiving an input voltage and an output voltage of the operational amplifier circuit;
    providing a rate-increasing current to the operational amplifier circuit or extracting the rate-increasing current from the operational amplifier circuit according to a difference between the input voltage and the output voltage, so as to change a value of a bias current of the operational amplifier circuit; and
    providing an overdriving voltage to the operational amplifier circuit during an overdriving period according to a selection signal, so as to increase a rate of switching the input voltage to the output voltage, wherein a level of the overdriving voltage is higher or lower than levels of the input voltage and the output voltage.

10. The method of increasing the slew rate of the operational amplifier circuit as claimed in claim 9, further comprising:
providing the input voltage to the operational amplifier circuit during a first driving period before the overdriving period; and
providing the output voltage to the operational amplifier circuit during a second driving period after the overdriving period.

11. The method of increasing the slew rate of the operational amplifier circuit as claimed in claim 9, wherein when the level of the input voltage is lower than the level of the output voltage, the level of the overdriving voltage is higher than the levels of the input voltage and the output voltage.

12. The method of increasing the slew rate of the operational amplifier circuit as claimed in claim 9, wherein when the level of the input voltage is higher than the level of the output voltage, the level of the overdriving voltage is lower than the levels of the input voltage and the output voltage.

* * * * *